US006812751B2

United States Patent
Sutandi et al.

(10) Patent No.: US 6,812,751 B2
(45) Date of Patent: Nov. 2, 2004

(54) LOW STANDBY CURRENT POWER-ON RESET CIRCUIT

(75) Inventors: Agustinus Sutandi, Murphy, TX (US); Daran DeShazo, Dallas, TX (US); Jason Stevens, Plano, TX (US); Craig Waller, Dallas, TX (US)

(73) Assignee: HPL Technologies, Inc., San Jose, CA (US)

( * ) Notice: Subject to any disclaimer, the term of this patent is extended or adjusted under 35 U.S.C. 154(b) by 62 days.

(21) Appl. No.: 10/271,952

(22) Filed: Oct. 15, 2002

(65) Prior Publication Data

US 2004/0070429 A1 Apr. 15, 2004

(51) Int. Cl.[7] .............................................. H03K 17/22
(52) U.S. Cl. ...................................................... 327/143
(58) Field of Search ................................. 327/145, 198

(56) References Cited

U.S. PATENT DOCUMENTS

| | | | | |
|---|---|---|---|---|
| 4,812,679 A | * | 3/1989 | Mahabadi .................... | 327/143 |
| 5,016,222 A | * | 5/1991 | Hashimoto ................... | 365/225 |
| 5,187,389 A | * | 2/1993 | Hall et al. ..................... | 327/50 |
| 5,300,822 A | * | 4/1994 | Sugahara et al. ............ | 327/142 |
| 5,302,861 A | * | 4/1994 | Jelinek ......................... | 327/143 |
| 5,396,115 A | * | 3/1995 | Coffman et al. ............. | 327/143 |
| 5,523,710 A | | 6/1996 | Miyake et al. ............... | 327/198 |
| 5,744,990 A | * | 4/1998 | Burstein et al. ............. | 327/143 |
| 5,847,586 A | * | 12/1998 | Burstein et al. ............. | 327/143 |
| 5,864,247 A | * | 1/1999 | Hirano et al. ................ | 327/143 |
| 5,959,477 A | * | 9/1999 | Chung ......................... | 327/143 |
| 6,204,701 B1 | * | 3/2001 | Tsay et al. ................... | 327/143 |
| 6,538,482 B2 | * | 3/2003 | Hirano et al. ................ | 327/143 |
| 2003/0122597 A1 | * | 7/2003 | Hirano et al. ................ | 327/143 |

FOREIGN PATENT DOCUMENTS

| | | | | |
|---|---|---|---|---|
| JP | 62235610 | 3/1989 | | |
| JP | 64-078520 | 3/1989 | .......... | H03K/17/22 |
| JP | 07-312541 | 11/1995 | .......... | H03K/17/22 |

OTHER PUBLICATIONS

Yasuda, T., Yamamoto, M., and Nishi, Takafumi, "A Power–On Reset Pulse Generator for Low Voltage Applications," Proceedings 2001 IEEE International Symposium on Circuits and Systems, vol. IV, pp. 598–601, 2001.

T. Yasuda et al., "A Power–On–Reset Pulse Generator For Low Voltage Applications", *2001 IEEE International Symposium on Circuits and systems*, pp. IV–598–IV–601, May 2001.

* cited by examiner

*Primary Examiner*—Terry D. Cunningham
(74) *Attorney, Agent, or Firm*—Sierra Patent Group, Ltd.

(57) ABSTRACT

A low standby current power-on reset circuit is described. A first NMOS transistor's drain is coupled to a first PMOS transistor's drain; source coupled to ground line; and gate coupled to a first capacitor coupled to ground line. The first PMOS transistor's source is coupled to power line; gate coupled to second capacitor coupled to ground line; and drain provides a power-on reset indication. A second PMOS transistor's source is coupled to power line; drain is coupled to drain of second NMOS transistor, gates of first PMOS, second PMOS, and second NMOS transistors, and second capacitor. The second NMOS transistor's source is coupled to gate of first NMOS transistor and first capacitor. A discharge circuit is coupled to power line, ground line, and first and second capacitors for discharging the capacitors when a voltage on power line drops below a level determined by the second PMOS transistor's threshold voltage.

10 Claims, 2 Drawing Sheets

LOW STANDBY CURRENT POWER-ON RESET CIRCUIT

FIELD OF THE INVENTION

The present invention generally relates to power-on reset circuits and in particular, to a low standby current power-on reset circuit.

BACKGROUND OF THE INVENTION

Power-on reset (POR) circuits are useful for indicating to other circuits in a system that power to the system has been turned on, or the system has been reset. In particular, the POR circuit will produce a falling (or rising) edge on an output or power-on reset indication when power (VDD) ramps up to a sufficient level to allow for circuit operation. Upon receipt of such power-on reset indication, the other circuits may then perform various useful functions such as resetting latches and performing start-up operations.

A low standby current POR circuit is further useful in applications where power consumption is to be minimized. Although feedback solutions are commonly employed to reduce the DC current in conventional POR circuit designs, such solutions are difficult to optimize over operational voltage and temperature ranges. This is because, they generally require very critical device sizing on the feedback devices.

Also, a practical retriggering capability for the POR circuit is also useful so that undesirable delay is avoided when retriggering the system. A practical retriggering capability in this case is understood to mean the ability to reproduce the correct power-on reset indication after the power supply (or line) has fallen below a critical level that can cause circuit operation to fail and then has risen above this critical level again.

OBJECTS AND SUMMARY OF THE INVENTION

Accordingly, it is an object of the present invention to provide a low standby current power-on reset circuit.

Another object is to provide a low standby current power-on reset circuit that exhibits practical retriggering capability.

These and additional objects are accomplished by the various aspects of the present invention, wherein briefly stated, one aspect is a power-on reset circuit comprising: an output stage circuit providing a power-on reset indication on an output line while a gate-to-source voltage of an output transistor in the output stage circuit is near a threshold voltage so as to turn the output transistor on with minimal current passing through the output stage circuit; and a charging circuit coupled to a power line and the output stage circuit so as to generate and hold the gate-to-source voltage of the output transistor when power to the power line is turned on or reset.

Another aspect is a power-on reset circuit comprising: an output stage circuit providing a power-on reset indication on an output line while a gate-to-source voltage of an output transistor in the output stage circuit is near a threshold voltage so as to turn the output transistor on with minimal current passing through the output stage circuit; and means for generating and holding the gate-to-source voltage of the output transistor when power to a power line is turned on or reset.

Still another aspect is a power-on reset circuit comprising: an output circuit including a capacitor responding to power on a power line being turned on or reset to drive generation of a power-on reset indication; and a discharge circuit coupled to the power line and the capacitor for discharging the capacitor when a voltage on the power line drops below a predetermined level.

Additional objects, features and advantages of the various aspects of the invention will become apparent from the following description of its preferred embodiments, which description should be taken in conjunction with the accompanying drawings.

DETAILED DESCRIPTION OF THE PREFERRED EMBODIMENT

Figure 1:
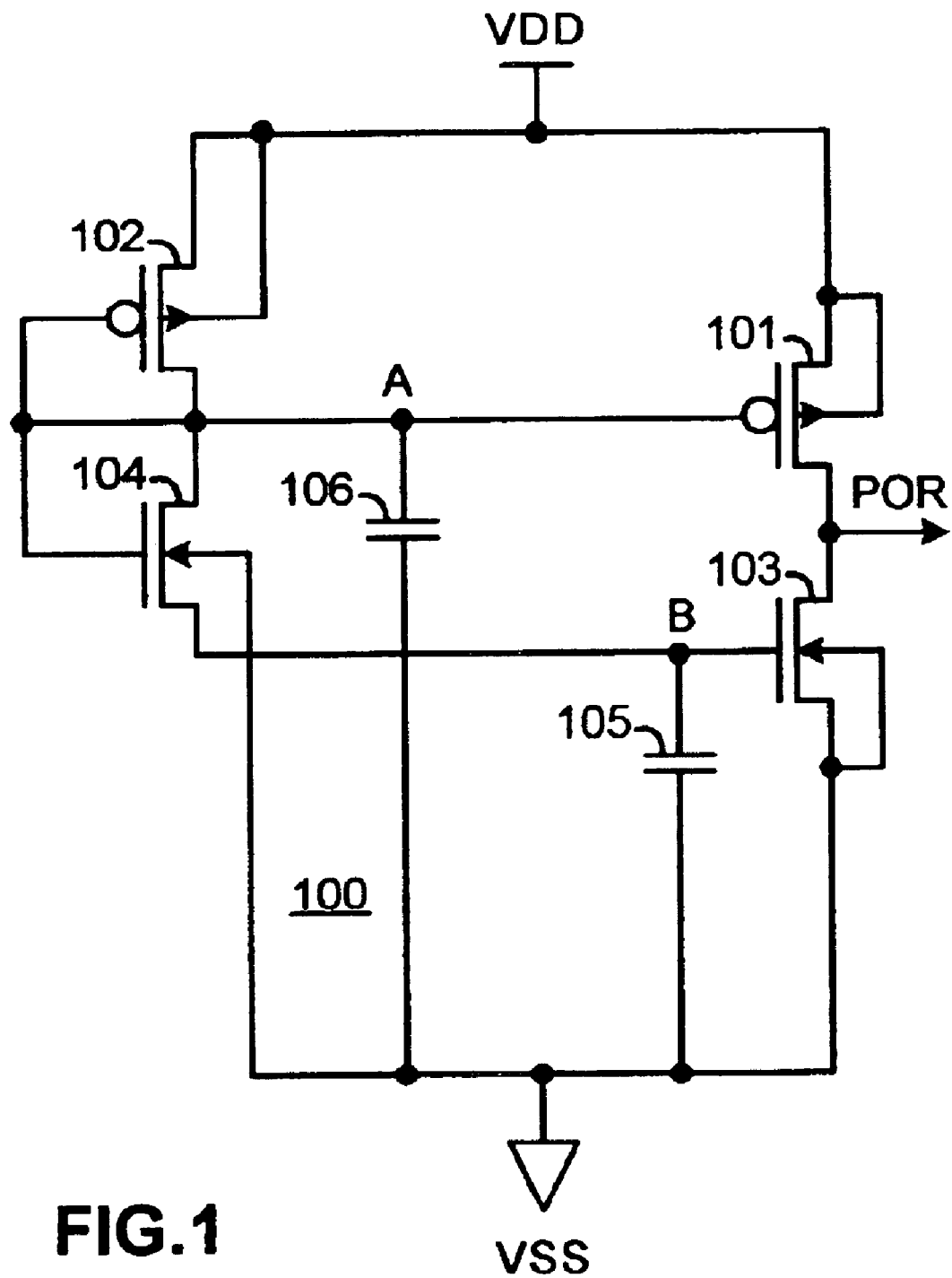
FIG. 1 illustrates, as an example, a first embodiment of a low standby current power-on reset circuit, utilizing aspects of the present invention.

FIG. 1 illustrates, as an example, a first embodiment of a low standby current power-on reset (POR) circuit 100 that provides a power-on reset indication on output line POR when power on a power line VDD is turned on or reset, wherein, in this example, the power-on reset indication is manifested by a voltage on the output line POR being pulled down to that of a ground line VSS which is at a LOW logic state.

The POR circuit 100 includes first and second PMOS transistors, 101 and 102, first and second NMOS transistors, 103 and 104, and first and second capacitors, 105 and 106. The first PMOS transistor 101 has its source and substrate coupled to the power line VDD, gate coupled to node A, and drain coupled to the drain of the first NMOS transistor 103. The first NMOS transistor 103 has its gate coupled to node B, and source and substrate coupled to the ground line VSS. The second PMOS transistor 102 also has its source and substrate coupled to the power line VDD. The respective gates and drains of the second PMOS transistor 102 and second NMOS transistor 104 are coupled together and to node A. The second NMOS transistor 104 has its source coupled to the gate of the first NMOS transistor 103 and to node B, and its substrate coupled to the ground line VSS. The first capacitor 105 is coupled between node B and the ground line VSS, and the second capacitor 106 is coupled between node A and the ground line VSS.

The first PMOS transistor 101 and first NMOS transistor 103 act as an output stage circuit providing the power-on reset indication at their coupled together drains while a gate-to-source voltage Vgs of the first PMOS transistor 101, acting as an output transistor, is near its threshold voltage Vtp so as to turn on with minimal current passing through it and the first NMOS transistor 103. Thus, by not significantly driving the gate voltage of the first PMOS transistor 101, only small standby current is generated in the POR circuit 100. The remainder of the POR circuit 100 acts as a charging circuit so as to generate and hold the appropriate gate-to-source voltage Vgs across the first PMOS transistor 101 when power to the power line VDD is turned on or reset.

In particular, when power to the power line VDD is turned on or reset, the voltage on the power line VDD rises from its initial level of 0 volts and increases up to the normal operating voltage of the system that is provided by a power supply coupled to the power line VDD. Once the voltage on the power line VDD (also referred to herein as the "supply voltage") exceeds an absolute value of a threshold voltage Vtp of the second PMOS transistor 102, the second PMOS transistor 102 turns on and consequently, the voltage on node A follows the rising supply voltage (offset by −Vtp) and charges the second capacitor 106, which was initially fully discharged. Around this time, an absolute value of a threshold voltage Vtp of the first PMOS transistor 101 is also exceeded, so that it also turns on and pulls up a voltage on the output line POR so that it follows the rising voltage on the power line VDD. Then, once the voltage on node A exceeds a threshold voltage Vtn of the second NMOS transistor 104, the second NMOS transistor 104 turns on and consequently, the voltage on node B follows the rising voltage on node A (offset by −Vtn) and charges the first capacitor 104, which was also initially fully discharged. Once the voltage on node B exceeds a threshold voltage Vtn of the first NMOS transistor 103, the first NMOS transistor 103 turns on and consequently, the output line POR is pulled down to the voltage of the ground line VSS, which represents a logic LOW value, thus generating the power-on reset indication provided at the coupled drains of the first PMOS transistor 101 and the first NMOS transistor 103 on the output line POR.

Thus, the combination of the second PMOS transistor 102, the second NMOS transistor 104, and the first NMOS transistor 103 effectively delays the power-on reset indication (i.e., the high to low transition) on the output line POR from the time power is first initially being applied to the power line VDD to the time it takes the voltage on the power line VDD to reach a value equal to (|Vtp|+2Vtn). Since the voltage on node A is less than the voltage on the power line VDD by approximately Vtp during the power-on reset operation, the gate-to-source voltage Vgs of the first PMOS transistor 101 is approximately equal to Vtp and consequently, minimal current is passing through it.

The first and second capacitors 105 and 106 hold voltages on the respective gates of the first NMOS transistor 103 and first PMOS transistor 101 to keep the power-on reset indication active while passing minimal current through the first PMOS transistor 101. When power on the power line VDD is subsequently removed or turned off, stored charges on the first and second capacitors 105 and 106 slowly leak off, dropping their respective voltages back down to the voltage level of the ground line VSS. Meanwhile, power on the power line VDD is preferably not be turned back on during this time to ensure that the POR circuit 100 works properly.

Figure 2:
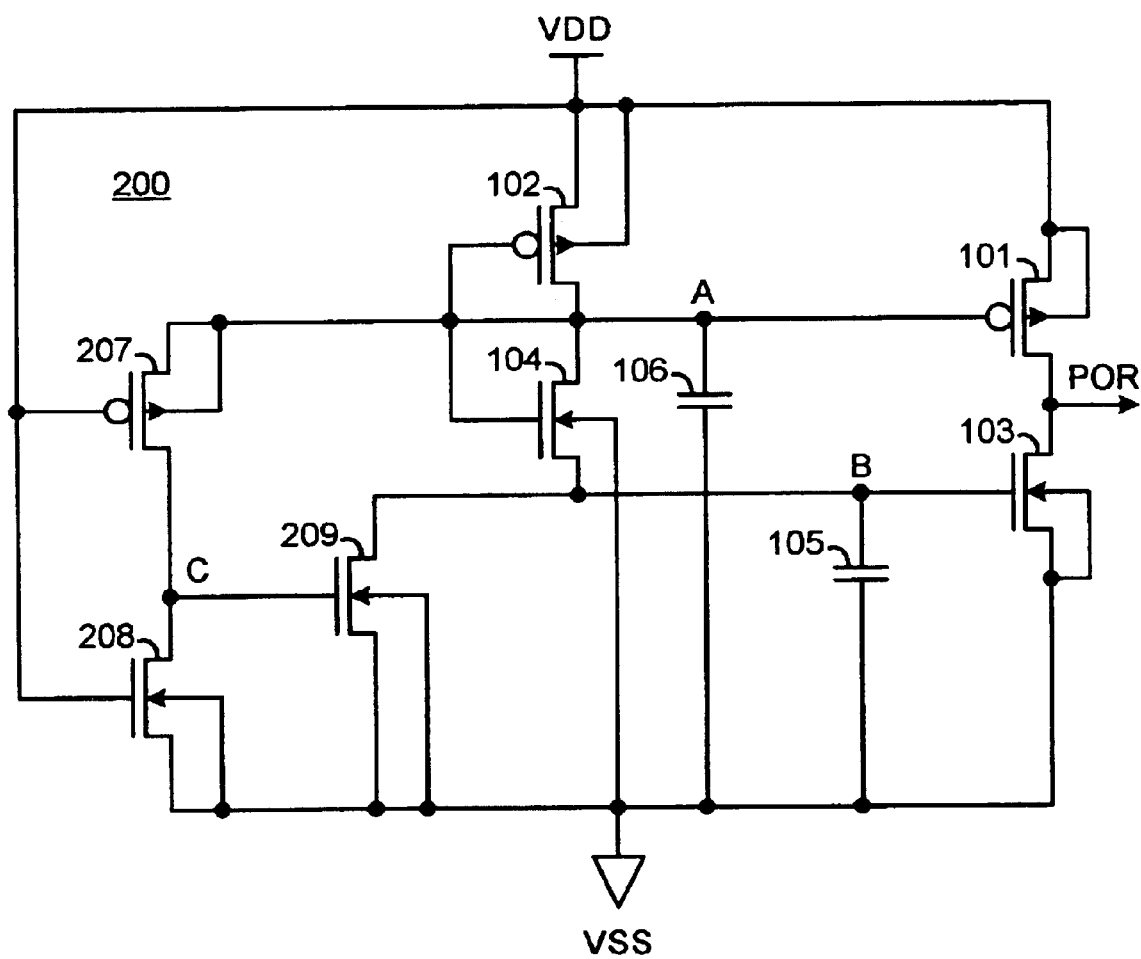
FIG. 2 illustrates, as an example, a second embodiment of a low standby current power-on reset circuit, utilizing aspects of the present invention.

FIG. 2 illustrates, as an example, a second embodiment of a low standby current POR circuit 200 with enhanced triggering capability. A main circuit of the POR circuit 200 is constructed and operates identically as the POR circuit 100 so that like components are given identical reference numbers in the two figures. The enhanced triggering capability is provided by a discharge circuit coupled to the power line VDD and the main circuit for quickly discharging its first capacitor 105 after a voltage on the power line VDD drops below a predetermined level.

The discharge circuit includes a third PMOS transistor 207, a third NMOS transistor 208, and a fourth NMOS transistor 209. The third PMOS transistor 207 has its gate coupled to the power line VDD, source and substrate coupled to the second capacitor 106 through the node A. The drain of the third PMOS transistor 207 is coupled to a node C, which is coupled to a drain of the third NMOS transistor 208 and a gate of the fourth NMOS transistor 209. The third NMOS transistor 208 also has its gate coupled to the power line VDD, and its source and substrate coupled to the ground line VSS. The fourth NMOS transistor 209 has its drain coupled to the first capacitor 105 through node B, and its source and substrate coupled to the ground line VSS.

When power to the power line VDD is turned off, the voltage on the power line VDD falls from the normal operating voltage of the system down to 0 volts. Until the voltage on the power line VDD drops by the threshold voltage Vtp of the second PMOS transistor 102, the second PMOS transistor 102 remains turned off and consequently, the voltage on node A remains approximately the same as before power was turned off. Once the voltage on the power line VDD falls to a level that is less by the threshold voltage Vtp of the second PMOS transistor 102, however, the second PMOS transistor 102 turns on and consequently, the voltage on node A starts to follow the supply voltage down (offset by +Vtp). Once the voltage on the power line VDD drops to the threshold voltage Vtn of the third NMOS transistor 208, the third NMOS transistor 208 is turned off and consequently, the voltage at node C is pulled up to the voltage at node A. This causes the fourth NMOS transistor 209 to be turned on and consequently, provides a discharge path to the ground line VSS for the voltage at node B. For robust operation, the threshold voltage Vtn of the fourth NMOS transistor 209 is preferably less than that of nominal NMOS transistors such as the first NMOS transistor 103, the second NMOS transistor 104, and the third NMOS transistor 208.

Although the various aspects of the present invention have been described with respect to preferred embodiments, it will be understood that the invention is entitled to full protection within the full scope of the appended claims.

We claim:

1. A power-on reset circuit comprising:

an output stage circuit providing a power-on reset indication on an output line while a gate-to-source voltage of an output transistor of said output stage circuit is near a threshold voltage so as to turn said output transistor on with minimal current passing through said output stage circuit, wherein said output transistor is a first PMOS transistor having a gate, a source coupled to said power line, and a drain coupled to said output line and wherein said output stage circuit includes a first NMOS transistor having a gate, a drain coupled to said first PMOS transistor drain, and a source coupled to a ground line so as to pull a voltage on said output line down to ground to generate said power-on reset indication when turned on; and a charging circuit coupled to a power line and said output stage circuit so as to generate and hold said gate-to-source voltage of said output transistor when power to said power line is turned on or reset, said charging circuit including a first capacitor coupled between said first NMOS transistor gate and said ground line, and an input circuit generating and holding a first voltage provided to said first PMOS transistor gate so as to generate and hold said gate-to-source voltage of said first PMOS transistor, and charging up said first capacitor to a second voltage so as to turn said first NMOS transistor on when said power on said power line is turned on or reset wherein said input circuit includes a second PMOS transistor having a gate, a drain, and a source coupled to said power line, a second NMOS transistor having gate coupled to said gates of said first PMOS and said second PMOS transistors, a drain coupled to said second PMOS transistor drain and said gates of said second PMOS, said first PMOS, and said second NMOS transistors, and a source is coupled to said first NMOS transistor gate and said first capacitor, and a second capacitor coupled between said coupled gates of said second PMOS, said first PMOS, and said second NMOS transistors, and said ground line.

2. The power-on reset circuit according to claim 1, further comprising a discharge circuit coupled to said first capacitor for discharging said first capacitor when a voltage on said power line drops below a predetermined level.

3. The power-on reset circuit according to claim 2, wherein said predetermined level is a determined by a threshold voltage of said second PMOS transistor.

4. The power-on reset circuit according to claim 3, wherein said discharge circuit includes:
- a third PMOS transistor having a gate, a source, and a drain, wherein said third PMOS transistor gate is coupled to said power line, and said third PMOS transistor source is coupled to said second capacitor and said first PMOS, said second PMOS, and said second NMOS transistor gates;
- a third NMOS transistor having a gate, a drain, and a source, wherein said third NMOS transistor gate is coupled to said third PMOS transistor gate and said power line, said third NMOS transistor drain is coupled to said third PMOS transistor drain, and said third NMOS transistor source is coupled to said ground line; and
- a fourth NMOS transistor having a gate, a drain, and a source, wherein said fourth NMOS transistor gate is coupled to said third PMOS and said third NMOS transistor drains, said fourth NMOS transistor drain is coupled to said first NMOS transistor gate, said second NMOS transistor source, and said first capacitor, and said fourth NMOS transistor source is coupled to said ground line.

5. A power-on reset circuit comprising:
- an output stage circuit providing a power-on reset indication on an output line while a gate-to-source voltage of an output transistor of said output stage circuit is near a threshold voltage so as to turn said output transistor on with minimal current passing through said output stage circuit wherein said output stage circuit includes a first NMOS transistor coupled to said output transistor and a ground line so as to pull a voltage on said output line down to ground to generate said power-on reset indication when turned on and wherein said output transistor is a first PMOS transistor having a gate, a source coupled to said power line, and a gate and drain coupled together to provide said power-on reset indication on said output line;
- means for generating and holding said gate-to-source voltage of said output transistor when power to a power line is turned on or reset wherein said gate-to-source voltage generating and holding means includes a first capacitor coupled between said first NMOS transistor gate and said ground line, a second PMOS transistor having a gate, a drain, a source coupled to said power line, a second NMOS transistor having a gate, a drain, and a source, wherein said second NMOS transistor gate is coupled to said gates of said first PMOS and said second PMOS transistors, said second NMOS transistor drain is coupled to said second PMOS transistor drain and said gates of said second PMOS, said first PMOS, and said second NMOS transistors, and said second NMOS transistor source is coupled to said first NMOS transistor gate and said first capacitor, and a second capacitor coupled between said coupled gates of said second PMOS, said first PMOS, and said second NMOS transistors, and said ground line; and
- means for discharging said first capacitor when a voltage on said power line drops below a predetermined level.

6. The power-on reset circuit according to claim 5, wherein said predetermined level is determined by a threshold voltage of said second PMOS transistor.

7. A power-on reset circuit comprising:
- a main circuit including a capacitor responding to power on a power line being turned on or reset to drive generation of a power-on reset indication wherein said main circuit includes a first PMOS transistor having a gate, a source, and a drain, wherein said first PMOS transistor source is coupled to said power line, and said first PMOS transistor drain provides said power-on reset indication, and a first NMOS transistor having a gate, a drain, and a source, wherein said first NMOS transistor drain is coupled to said first PMOS transistor drain, said first NMOS transistor source is coupled to a ground line, a second PMOS transistor having a grate, a source, and a drain, wherein said second PMOS transistor source is coupled to said power line, a second NMOS transistor having a gate, a drain, and a source, wherein said second NMOS transistor gate is coupled to said gates of said first PMOS and said second PMOS transistors, said second NMOS transistor drain is coupled to said second PMOS transistor drain and said gates of said second PMOS, said first PMOS, and said second NMOS transistors, and said second NMOS transistor source is coupled to said first NMOS transistor gate and a first capacitor, and a second capacitor coupled between said coupled gates of said second PMOS, said first PMOS, and said second NMOS transistors, and said ground line; and
- a discharge circuit coupled to said power line and said capacitor for discharging said capacitor when a voltage on said power line drops below a predetermined level wherein said capacitor is a first capacitor coupled between said first NMOS transistor gate and said ground line.

8. The power-on reset circuit according to claim 7, wherein said predetermined level is determined by a threshold voltage of said second PMOS transistor.

9. The power-on reset circuit according to claim 8, wherein said discharge circuit includes:
- a third PMOS transistor having a gate, a source, and a drain, wherein said third PMOS transistor gate is coupled to said power line, and said third PMOS transistor source is coupled to said second capacitor and said first PMOS, said second PMOS, and said second NMOS transistor gates;
- a third NMOS transistor having a gate, a drain, and a source, wherein said third NMOS transistor gate is coupled to said third PMOS transistor gate and said power line, said third NMOS transistor drain is coupled to said third PMOS transistor drain, and said third NMOS transistor source is coupled to said ground line; and
- a fourth NMOS transistor having a gate, a drain, and a source, wherein said fourth NMOS transistor gate is coupled to said third PMOS and said third NMOS transistor drains, said fourth NMOS transistor drain is coupled to said first NMOS transistor gate, said second NMOS transistor source, and said first capacitor, and said fourth NMOS transistor source is coupled to said ground line.

10. The power-on reset circuit according to claim 9, wherein a threshold voltage of said fourth NMOS transistor is less than threshold voltages of said first NMOS, second NMOS and third NMOS transistors.

* * * * *